United States Patent [19]

Omori et al.

[11] Patent Number: 5,391,422

[45] Date of Patent: Feb. 21, 1995

[54] DIAMOND- OR DIAMOND-LIKE CARBON-COATED HARD MATERIALS

[75] Inventors: Naoya Omori; Toshio Nomura, both of Itami, Japan

[73] Assignee: Sumitomo Electric Industries, Ltd., Osaka, Japan

[21] Appl. No.: 178,622

[22] Filed: Jan. 7, 1994

Related U.S. Application Data

[63] Continuation of Ser. No. 831,547, Feb. 5, 1992, abandoned.

[30] Foreign Application Priority Data

Feb. 18, 1991 [JP] Japan .................. 3-023495
Feb. 18, 1991 [JP] Japan .................. 3-023496

[51] Int. Cl.⁶ .................................................. C30B 29/04
[52] U.S. Cl. .................................. 428/212; 428/156; 428/172; 428/336; 428/446; 428/408; 428/697
[58] Field of Search ............ 428/408, 697, 446, 701, 428/212, 156, 172, 336

[56] References Cited

U.S. PATENT DOCUMENTS 4,731,296 3/1988 Kikuchi et al. ............... 428/408

FOREIGN PATENT DOCUMENTS 61-106494 5/1986 Japan .
61-201698 9/1986 Japan .
62-119 1/1987 Japan .
62-196371 8/1987 Japan .

Primary Examiner—A. A. Turner
Attorney, Agent, or Firm—Wenderoth, Lind & Ponack

[57] ABSTRACT

A diamond-coated hard material having a diamond- or diamond-like carbon coated layer with a high bonding strength to a substrate is provided. The coated hard material comprising a diamond- and/or diamond-like carbon-coating layer formed on the surface of a hard material, i.e. substrate is characterized in that (I) (1) microscopic roughness is present on the surface of the substrate and (2) protrusive parts thereof are defined by the surface roughness Rmax within a range of 1.0 to 30 μm in a standard length when the standard length is 50 μm in the interface of the diamond- and/or diamond-like carbon coated layer and the substrate, and (II) (1) microscopic roughness is present on the surface of the substrate, (2) at least one protrusive part is present in a standard length when the standard length is 10 μm in the interface of the diamond- and/or diamond-like carbon coated layer and the substrate, (3) the ratio of sum A of the lengths of dent parts to sum B of the lengths of the protrusions is in the range of $0.05 \leq A/B \leq 20$ in the standard length in the interface and (4) the protrusive parts are intruded into the diamond-coated layer.

2 Claims, 1 Drawing Sheet

DIAMOND- OR DIAMOND-LIKE CARBON-COATED HARD MATERIALS

This application is a continuation of now abandoned application Ser. No. 07/831,547, filed Feb. 5, 1992.

BACKGROUND OF THE INVENTION

1. Field of the Invention

This invention relates to a diamond-coated hard material having a diamond-or diamond-like carbon-coating layer with a high bonding strength to a substrate.

2. Description of the Prior Art

Diamond having many excellent properties, for example, very high hardness, chemical stability, high heat conductivity, high sound wave propagation speed, etc. has widely been used as hard materials utilizing these properties or diamond or diamond-like carbon coated hard materials, illustrative of which are as follows:

① single crystal diamond, sintered diamonds or diamond-coated cutting tools such as throwaway inserts, drills, microdrills, endmills, etc., which are capable of cutting Al, Cu, various practically used light metals or alloys thereof at a high temperature and obtaining well finished surfaces, because of hardly reacting with these metals or alloys.

② various wear resistance tools such as bonding tools capable of working for a long time with a high dimensional precision, because of high wear resistance.

③ various machine parts such as radiating plates.

④ various vibration plates such as speakers.

⑤ various electronic parts.

In the production of artificial diamond, there are methods of forming diamond coating layers from gaseous phase, for example, microwave plasma CVD method, RF-plasma CVD method, EA-CVD method, induction field microwave plasma CVD method, RF hot plasma CVD method, DC plasma CVD method, DC plasma jet method, filament hot CVD method, combustion method and like. These methods are useful for the production of diamond-coated hard materials.

Since many of the diamond-coated hard materials are lacking in bonding strength of the diamond-coated layer to a substrate, the diamond-coated layer is stripped to shorten the life in many cases. The great reason therefor is that diamond not capable of forming intermediate layers with all materials has low wettability with other materials.

In order to obtain a diamond-coated hard material having a high bonding strength, there have been proposed a method comprising selecting a substrate having the same heat expansion coefficient as diamond (Japanese Patent laid-Open Publication No. 291493/1986, proposing sintered compacts containing $Si_3N_4$ as a predominant component, and sintered compacts containing SiC as a predominant component), a method comprising subjecting the surface of a substrate to etching to remove metals having bad infueneces upon formation of the diamond coating layer on the substrate surface and thereby increasing the formation density of diamond nuclei on the substrate surface (Japanese Patent Laid-Open Publication No. 201475/1989, etching the surface of a cemented carbide with an acid solution to remove Co metal component and to suppress graphitization of the diamond nuclei; Japanese Patent Laid-Open Publication No. 124573/1986, subjecting the surface of a substrate to a scratching treatment with diamond grains or a diamond wheel and thereby improving the nuclei forming density on the surface of the substrate), etc.

As described above, diamond is chemically stable and does not form intermediate compounds with all materials. When a diamond-coated hard material having an excellent bonding strength is prepared, therefore, such a condition must be provided that a diamond coating layer and a substrate are bonded by a strong physical strength.

The inventors have made studies to realize this condition and consequently, have found that when protrusions having a high bonding strength to a substrate are formed on the surface of the substrate by a chemical or mechanical means and a diamond coating layer is formed thereon, thereby forming such a state that protrusions are intruded into the diamond coating layer, the bonding strength between the diamond coating layer and the substrate is rendered very high. This can be considered to be due to that the contact area of the diamond coating layer with the substrate is increased and the protrusions have anchor action in the diamond coating layer, whereby the diamond coating layer is hard to be stripped from the substrate.

SUMMARY OF THE INVENTION

It is an object of the present invention to provide a diamond-coated hard material having an excellent bonding strength, whereby the above described problems can be solved.

The above described object can be attained by:

(I) a coated hard material comprising a diamond- and/or diamond-like carbon-coating layer formed on the surface of a hard material, i.e. substrate, characterized in that (1) microscopic roughness is present on the surface of the substrate and (2) protrusive parts thereof are defined by the surface roughness Rmax within a range of 1.0 to 30 μm in a standard length when the standard length is 50 μm in the interface of the diamond- and/or diamond-like carbon coated layer and the substrate, and (II) a coated hard material comprising a diamond- and/or diamond-like carbon-coating layer formed on the surface of a hard material, i.e. substrate, characterized in that (1) microscopic roughness is present on the surface of the substrate, (2) at least one protrusive part is present in a standard length when the standard length is 10 μm in the interface of the diamond- and/or diamond-like carbon coated layer and the substrate, (3) the ratio of sum A of the lengths of dent parts to sum B of the lengths of the protrusions is in the range of $0.05 \leq A/B \leq 20$ in the standard length in the interface and (4) the protrusions are intruded into the diamond-coated layer.

DETAILED DESCRIPTION OF THE INVENTION

Figure 1:
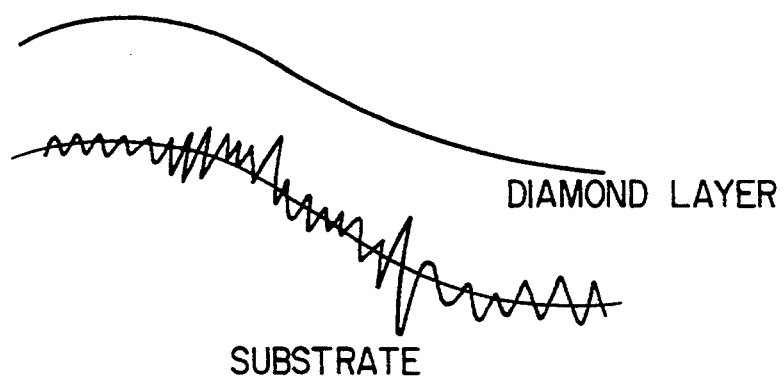
FIG. 1 is a schematic view of a coating layer-substrate interface in one embodiment of the present invention.

In the present invention, the roughness is not macroscopic roughness formed by a scratching treatment with (1) a diamond wheel or (2) diamond grinding grains, but microscopic roughness in a very small range, i.e. roughness in a standard length of 50 μm or 10 μm in a diamond coating layer-substrate interface.

The inventors have made various toughened states and consequently, have found that when the surface roughness in the substrate interface is defined by Rmax of 1.0 to 30 μm in the standard length of 50 μm and the protrusive parts are intruded by at least 0.2μm into the diamond coating layer-substrate interface, a strong bonding strength is obtained. This surface roughness is defined as a surface roughness (Rmax) of a substrate after coated by lapping a cross-section of the substrate coated with diamond, observing and photographing to review a boundary line of the diamond coating layer-substrate interface. This corresponds to the above described invention (I).

The inventors have made various toughened states and consequently, have found that when at least one protrusive part is present in the standard length of 10 μm and the ratio of sum A of the lengths of dent parts to sum B of the lengths of the protrusions is in the range of $0.05 \leq A/B \leq 20$ in the standard length and the protrusions are intruded by 0.2 μm into the diamond-coated layer, a high density strength is obtained. This is calculated by lapping a cross-section of the substrate coated with diamond, observing and photographing to review and model a boundary line of the diamond coating layer-substrate interface. This corresponds to the above described invention (II).

In the present invention, it is preferable to carry out the commonly used scratching treatment of a substrate with diamond grains in order to promote formation of diamond nuclei on the whole surface of the substrate at the initial period of coating. During the same time, this scratching treatment is more preferably carried out by adding the substrate and diamond grains to a solvent such as water, ethyl alcohol, acetone, etc. and then applying ultrasonic wave thereto, since a scratching treatment by pressing hard diamond grains against the substrate in physical manner results in breakage of the resulting protrusions. Diamond nuclei are uniformly formed on the whole protrusive and non-protrusive parts of the substrate surface by this scratching treatment, whereby it is rendered possible to form such a state that the protrusions are intruded into the diamond coated layer.

As a useful method for forming the specified roughness on a substrate, there are ① a method comprising depositing columnar or hexagonal pillar crystal grains and/or needle crystal grains on the surface of a substrate, ② a method comprising removing an etchable binder by etching, ③ a method comprising masking a substrate, etching and then removing the mask, ④ a method comprising physically working, for example, by appllying laser and the like. Depending on the kind of the substrate, a suitable method should be chosen therefrom.

The method ① consists in subjecting a substrate to some heat treatment, freely growing columnar or hexagonal pillar crystal grains or needle crystal grains and/or promoting secondary crystal generation on the surface thereof by the substrate component, the method ② is available for a material composed of a hard phase and a binder phase, differing in corrosive property against acids and alkalies, and is more available in the case of using a hard phase previously being in a columnar or hexagonal pillar or needle form and the method ③ consists in providing a mask in a suitable pattern using a photomask, etching and then removing the mask by etching.

As a material for forming the protrusion, there can be used silicon carbide, silicon carbide-containing materials, tungsten, tungsten carbides or carbonitrides, carbides or carbonitrides of tungsten with at least one metal, titanium nitrides, carbides, earbonitrides or solid solutions thereof or mixtures thereof and materials containing them.

The material for forming the toughened part is preferably consolidated in one body with the substrate and is preferably a same material as that of the substrate. Of course, similar materials but differing in composition can be used.

Figure 2:
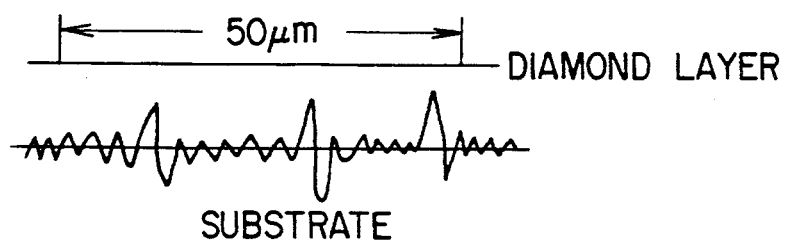
FIG. 2 is a schematic view to illustrate the state shown in FIG. 1 by linearly drawing it.

In FIG. 1, the state of the diamond-coated layer- or diamond-like carbon-coated layer-substrate interface according to the present invention (I) is schematically shown. That is, a macroscopic undulation appears in the interlayer, but Rmax is calculated regarding this undulation as linear as shown in FIG. 2.

Figure 3:
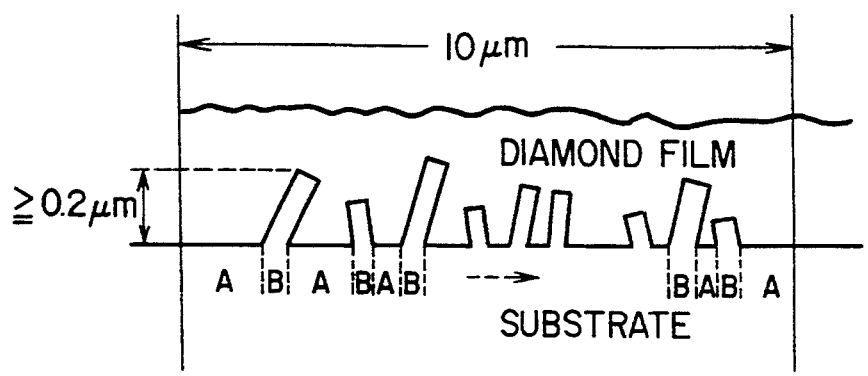
FIG. 3 is a schematic view of a coating layer-substrate interface in another embodiment of the present invention.

In FIG. 3, the state of the diamond-coated layer- or diamond-like carbon-coated layer-substrate interface according to the present invention (II) is schematically shown. Herein, the ratio of sum A of the protrusion lengths, i.e. ΣA to sum B of the dint lengths, i.e. ΣB must be in the range of $0.05 \leq \Sigma A/\Sigma B \leq 20$ and the intruded lengths of the protrusions are preferably at least 0.2 μm. For example, when one protrusion of 0.5 μm is present in 10 μm, $\Sigma A/\Sigma B = 19$.

In the present invention (I), the formed protrusive parts should satisfy the requirements that when a standard length is 50 μm in the interface of a diamond- and/or diamond-like carbon coated layer and a substrate, the surface roughness of the substrate interface is represented by an Rmax of 1.0 to 30 μm in the standard length and the protrusive parts are preferably intruded in the diamond coated layer with at least 0.2 μm. When the surface roughness at the substrate interface is represented by a Rmax of less than 1.0 μm, the bonding strength is not increased, while if more than 30 μm, on the contrary, the bonding strength is lowered. When the maximum intrusive depth of the protrusions is at most 0.2 μm, the bonding strength is substantially similar to that in the case of providing no protrusion.

In the present invention (II), it is required that when the standard length is 10 μm in the diamond- and/or diamond-like carbon coated layer-substrate interface, at least one protrusion is formed in this standard length, the ratio of sum B of the lengths of protrusions and sum A of the lengths of the protrusions is in the range of 0.05 to 20 and the protrusions are intruded into the diamond-coated layer. In this ease, the intruded length is preferably at least 0.2 μm. When the ratio of sum B of the lengths of protrusions and sum A of the lengths of the protrusions is outside the range of $0.05 \leq \Sigma A/\Sigma B \leq 20$, the bonding strength is not improved.

As the substrate, any hard materials can be used, for example, cemented carbides, cermets, $Al_2O_3$, silicon carbide and other ceramics. Above all, when protrusions of titanium compounds such as titanium carbides, nitrides and carbonitrides and/or titanium compounds-containing materials, tungsten carbides and/or carbides of tungsten alloys and/or materials containing these compounds or materials are present, a high bonding strength can be obtained. Furthermore, when the shape of the protrusion is a columnar or hexagonal pillar crystal or needle crystal with an aspect ratio of at least 1.5, a bonding strength is further increased.

As to the thickness of the diamond coated layer, if less than 0.1 μm, no improvement of various properties by the coated layer, such as wear resistance, is found, while if more than 200 μm, further improvement of the properties cannot be given. Therefore, a thickness of 0.1 to 200 μm is preferable.

The foregoing illustration is conducted as to a case where diamond is coated, but the present invention can be applied with similar benefits to cases where diamond-like carbon is present in a diamond-coated layer, one or more of these layers are coated and the coated layer contains foreign atoms such as boron, nitrogen, etc. Where diamond-like carbon is coated, the excellent advantages of the present invention can also be obtained.

The following examples are given in order to illustrate the present invention in detail without limiting the same.

EXAMPLE 1

A throwaway insert comprising silicon carbide whiskers ceramic (specifically, $Al_2O_3$-35 vol % SiC whiskers-5 wt % $ZrO_2$) as a substrate and having a shape of SPG 422 was made, brought into contact with fused NaOH and etched to expose needle crystals of silicon carbide whiskers having a minor axis of 1 μm and a major axis of 8 μm on the surface of the insert. This insert and 2 g of diamond grains each having a grain diameter of 8 to 16 μm were added to ethyl alcohol, to which supersonic wave vibration was added for 15 minutes. Using 2.45 GHz microwave plasma CVD apparatus, the thus resulting insert was heated at 1000° C. and maintained in a mixed plasma of hydrogen-2% methane at a total pressure of 80 Torr for 8 hours to prepare a cutting insert coated with diamond of 8 μm in layer thickness.

For comparison, a comparative insert was prepared by using a substrate having the same shape and composition as described above without conducting the etching treatment and providing a diamond coated layer on the insert having no needle crystals of silicon carbide whiskers on the surface thereof (The ultrasonic wave treatment was not carried out for the comparative sample).

In this test, it was confirmed by the Raman spectrometry that the coated layer deposited on the surface of the substrate was a diamond coated layer.

Using these cutting inserts, intermittent cutting tests were carried out under the following conditions.

Workpiece to be cut: Al-24 wt % Si alloy (block material)
Cutting Speed : 400 m/min
Feed : 0.1 mm/rev
Cutting Depth : 0.5 mm When the flank wear width, the wear state of the edge and the deposition state of the workpiece, after 3 and 10 minutes, were observed, the cutting insert of the present invention showed normal wearing represented by a flank wear width of 0.05 mm after 10 minutes from start of cutting and deposition of the workpiece was hardly observed. On the other hand, in observation of the cutting edge after 3 minutes from start of cutting, a large peeling of the diamond coated layer was found, the flank wear width amounted to 0.16 mm and the workpiece was subject to marked metal deposition, so that the cutting had to be stopped.

When the insert after the cutting test was cut, subjected to lapping and then the interface of the substrate and diamond coated layer was observed by an optical microscope, the insert of the present invention gave the results that silicon carbide whiskers were intruded into the diamond-coated layer by at most 3.5 μm and in the interface, the microscopic surface roughness was represented by an Rmax of 4 to 5 μm in the standard length of 50 μm. In the comparative insert, on the contrary, there were found no silicon carbide whiskers in the interface of the substrate and diamond-coated layer, nor intrusion of the substrate into the diamond-coated layer.

EXAMPLE 2

A throwaway insert comprising JIS-K10 cemented carbides (specifically, WC-5% Co) as a substrate and having a shape of SPG 422 was prepared, subjected to mirror working and then to laser working, whereby to obtain inserts (1) and (2) of the present invention worked in:

(1) lattice of grooves each having a depth of 3.0 μm and a width of 1.5 μm at an interval of 2 μm and (2) lattice of grooves each having a depth of 6.0 μm and a width of 3.0 μm at an interval of 3 μm.

The resulting samples had respectively a microscopic Rmax of 3 and 6 μm as calculated values.

In the similar manner to described above, this insert and 2 g of diamond grains each having a grain diameter of 8 to 16 μm were added to ethyl alcohol, to which supersonic wave vibration was added for 15 minutes. On the surface of the thus prepared insert was formed a diamond-coated layer with a thickness of 6 μm by the use of a known hot filament CVD method under the following conditions:

Reaction Tube Vessel : Quartz Tube of 200 mm in Diameter
Filament Material : Metallic W
Filament Temperature : 2400° C.
Distance between Filament and
Insert Surface : 7.0 mm
Total Pressure : 100 Torr
Atmospheric Gas : $H_2$-1.5% $CH_4$ Gas
Time : 7 hours For comparison, a comparative insert was prepared by using a substrate having the same shape and composition as described above without conducting the laser treatment and providing a diamond coated layer on the insert (The ultrasonic wave treatment was not carried out for the comparative sample).

In this test, it was confirmed by the Raman spectrometry that the coated layer deposited on the surface of the substrate was a diamond coated layer.

Using these cutting inserts, intermittent cutting tests were carried out under the following conditions.

Workpiece to be cut: Al-12 wt % Si alloy (round rod)
Cutting Speed : 1000 m/min
Feed : 0.15 mm/rev
Cutting Depth : 1.5 mm When the flank wear width, the wear state of the edge and the deposition state of the workpiece, after 5 and 30 minutes, were observed, the cutting inserts (1) and (2) of the present invention showed normal wearing represented by a flank wear width of 0.02 mm or 0.03 mm after 10 minutes from start of cutting and deposition of the workpiece was hardly observed. On the other hand, in observation of the cutting edge after 5 minutes from start of cutting, a large peeling of the diamond coated layer was found, the flank wear width amounted to 0.24 mm and the workpiece was subject to marked metal deposition, so that the cutting had to be stopped.

When each of the inserts after the cutting test was cut, subjected to lapping and then the interface of the substrate and diamond coated layer was observed by an optical microscope, the insert of the present invention gave the results that the cemented carbide as a substrate was intruded into the diamond-coated layer by at most 3 μm and in the interface, the microscopic surface roughness was represented by an Rmax of 2.8 or 6.1 μm in the standard length of 50 μm, which was confirmed to be substantially the same as the value measured before the coating. In the comparative insert, on the contrary, there were found no intrusion of the substrate into the diamond-coated layer, nor presence of the roughness.

EXAMPLE 3

A throwaway insert comprising silicon carbide whiskers ceramic (specifically, $Al_2O_3$-35 vol % SiC whiskers-5 wt % $ZrO_2$) as a substrate and having a shape of SPG 422 was made, brought into contact with fused NaOH and etched to expose needle crystals of silicon carbide whiskers having a minor axis of 1 μm and a major axis of 8 μm on the surface of the insert. This insert and 2 g of diamond grains each having a grain diameter of 8 to 16 μm were added to ethyl alcohol, to which supersonic wave vibration was added for 15 minutes. Using 2.45 GHz microwave plasma CVD apparatus, the thus resulting insert was heated at 1000° C. and maintained in a mixed plasma of hydrogen-2% methane at a total pressure of 80 Torr for 7 hours to prepare a cutting insert coated with diamond of 9 μm in layer thickness.

For comparison, a comparative insert was prepared by using a substrate having the same shape and composition as described above without conducting the etching treatment and providing a diamond coated layer on the insert having no needle crystals of silicon carbide whiskers on the surface thereof (The ultrasonic wave treatment was not carried out for the comparative sample).

In this test, it was confirmed by the Raman spectrometry that the coated layer deposited on the surface of the substrate was a diamond coated layer.

Using these cutting inserts, intermittent cutting tests were carried out under the following conditions.

Workpiece to be cut: Al-24 wt % Si alloy (block material)
Cutting Speed : 400 m/min
Feed : 0.1 mm/rev
Cutting Depth : 0.5 mm When the flank wear width, the wear state of the edge and the deposition state of the workpiece, after 3 and 10 minutes, were observed, the cutting insert of the present invention showed normal wearing represented by a flank wear width of 0.05 mm after 10 minutes from start of cutting and deposition of the workpiece was hardly observed. On the other hand, in observation of the cutting edge after 3 minutes from start of cutting, a large peeling of the diamond coated layer was found, the flank wear width amounted to 0.14 mm and the workpiece was subject to marked metal deposition, so that the cutting had to be stopped.

When the insert after the cutting test was cut, subjected to lapping and then the interface of the substrate and diamond coated layer was observed by an optical microscope, the insert of the present invention gave the results that silicon carbide whiskers were intruded into the diamond-coated layer by at most 4 μm and in the interface, 3 to 6 protrusions were present and A/B was 1.0 to 1.6 in the standard length of 10 μm. In the comparative insert, on the contrary, there were found no silicon carbide whiskers in the interface of the substrate and diamond-coated layer, nor intrusion of the substrate into the diamond-coated layer.

EXAMPLE 4

A throwaway insert comprising JIS-K10 cemented carbides (specifically, WC-5% Co) as a substrate and having a shape of SPG 422 was prepared, subjected to mirror working and then to laser working, whereby to obtain inserts (1) and (4) of the present invention worked in:

(1) lattice of grooves each having a depth of 3.0 μm and a width of 1.5 μm at an interval of 2 μm and (2) lattice of grooves each having a depth of 3.0 μm and a width of 3.0 μm at an interval of 3 μm.

(3) lattice of grooves each having a depth of 0.2 μm and a width of 1.5 μm at an interval of 2 μm and (4) lattice of grooves each having a depth of 3.0 μm and a width of 2.0 μm at an interval of 8 μm.

The resulting samples had respectively a A/B ratio of 1.75, 1.33 and 0.25.

In the similar manner to described above, this insert and 2 g of diamond grains each having a grain diameter of 8 to 16 μm were added to ethyl alcohol, to which supersonic wave vibration was added for 15 minutes. On the surface of the thus prepared insert was formed a diamond-coated layer with a thickness of 6 μm by the use of a known hot filament CVD method under the following conditions:

Reaction Tube Vessel : Quartz Tube of 200 mm in Diameter
Filament Material : Metallic W
Filament Temperature : 2400° C.
Distance between Filament and
Insert Surface : 7.0 mm
Total Pressure : 100 Torr
Atmospheric Gas : $H_2$-1.5% $CH_4$ Gas
Time : 7 hours For comparison, a comparative insert was prepared by using a substrate having the same shape and composition as described above without conducting the laser treatment and providing a diamond coated layer on the insert (The ultrasonic wave treatment was not carried out for the comparative sample).

In this test, it was confirmed by the Raman spectrometry that the coated layer deposited on the surface of the substrate was a diamond coated layer.

Using these cutting inserts, intermittent cutting tests were carried out under the following conditions.

Workpiece to be cut: Al-12 wt % Si alloy (round rod)
Cutting Speed : 1000 m/min
Feed : 0.15 mm/rev
Cutting Depth : 1.5 mm When the flank wear width, the wear state of the edge and the deposition state of the workpiece, after 5 and 30 minutes, were observed, the cutting inserts (1) and (4) of the present invention showed normal wearing represented by a flank wear width of 0.03 mm, 0.02 mm, 0.08 mm or 0.07 mm after 10 minutes from start of cutting and deposition of the workpiece was hardly observed. On the other hand, in observation of the cutting edge after 5 minutes from start of cutting, a large peeling of the diamond coated layer was found, the flank wear width amounted to 0.23 mm and the workpiece was subject to marked metal deposiition, so that the cutting had to be stopped.

When each of the inserts after the cutting test was cut, subjected to lapping and then the interface of the substrate and diamond coated layer was observed by an optical microscope, it was confirmed that the cemented carbide as a substrate was intruded into the diamond-coated layer by at most 3 μm and the ratio of A/B was a value expected. In the comparative insert, on the contrary, there were found no intrusion of the substrate into the diamond-coated layer, nor presence of the roughness.

The diamond- and/or diamond-like carbon-coated hard material of the present invention has better peeling resistance than the diamond- and/or diamond-like carbon-coated hard materials of the prior art. The method of Example 1 or 3 relates to a surface treatment utilizing the properties of a substrate, but that of Example 2 or 4 is an available and excellent method independent on the kind of a substrate. In the latter case, good results can be obtained even when using various ceramics or cermets containing silicon carbide, $Al_2O_3$, etc. as a predominant component as a substrate. The above described examples are given in the case of cutting tools, but of course, the hard materials of the present invention can be applied to not only wear resistance tools such as TAB tools, but also end mills, drills, drills for making hole on print substrates, reamers, etc.

What is claimed is:

1. A coated hard material comprising a diamond- and/or diamond-like carbon-coating layer formed on the surface of a hard material substrate, characterized in that (1) microscopic roughness is present on the surface of the substrate, (2) protrusive parts thereof having a height of at least 0.2 μm are defined by a surface roughness Rmax within a range of 1 to 30 μm in a standard length when the standard length is 50 μm in the interface bf the diamond- and/or diamond-like carbon-coated layer and the substrate, (3) at least one protrusive part having a height of at least 1 μm is present in a standard length when the standard length is 10 μm and the ratio of sum A of the lengths of dent parts to sum B of the lengths of the protrusions is in the range of 0.2 to 20, (4) the protrusive parts are intruded into the diamond-coated layer and (5) the material of the substrate is a cemented carbide or cermet.

2. A coated hard material comprising a diamond- and/or diamond-like carbon-coating layer formed on the surface of a hard material substrate, characterized in that (1) microscopic roughness is present on the surface of the substrate, (2) protrusive parts thereof having a height of at least 0.2 μm are defined by a surface roughness Rmax within a range of 1 to 30 μ m in a standard length when the standard length is 50 μm in the interface of the diamond- and/or diamond-like carbon-coated layer and the substrate, (3) at least one protrusive part having a height of at least 1 μm is present in a standard length when the standard length is 10 μm and the ratio of sum A of the lengths of dent parts to sum B of the lengths of the protrusions is in the range of 0.05 to 20, (4) the protrusive parts are intruded into the diamond-coated layer and (5) the material of the substrate is a ceramic.

* * * * *